United States Patent
Schie et al.

(10) Patent No.: US 11,755,850 B2
(45) Date of Patent: *Sep. 12, 2023

(54) SINGLE TRANSISTOR MULTIPLIER AND METHOD THEREFOR

(71) Applicants: David Schie, Houston, TX (US); Sergey Gaitukevich, Stallhofen (AT); Peter Drabos, Graz (AT); Andreas Sibrai, Soeding-Sankt Johann (AT); Erik Sibrai, Soeding-Sankt Johann (AT)

(72) Inventors: David Schie, Houston, TX (US); Sergey Gaitukevich, Stallhofen (AT); Peter Drabos, Graz (AT); Andreas Sibrai, Soeding-Sankt Johann (AT); Erik Sibrai, Soeding-Sankt Johann (AT)

( * ) Notice: Subject to any disclaimer, the term of this patent is extended or adjusted under 35 U.S.C. 154(b) by 83 days.

This patent is subject to a terminal disclaimer.

(21) Appl. No.: 17/362,376

(22) Filed: Jun. 29, 2021

(65) Prior Publication Data

US 2021/0326539 A1    Oct. 21, 2021

Related U.S. Application Data

(63) Continuation of application No. 16/291,311, filed on Mar. 4, 2019, now Pat. No. 11,087,099.

(Continued)

(51) Int. Cl.
*G06G 7/164*     (2006.01)
*H03F 3/45*      (2006.01)
*G06N 3/02*      (2006.01)

(52) U.S. Cl.
CPC .............. *G06G 7/164* (2013.01); *G06N 3/02* (2013.01); *H03F 3/45179* (2013.01); *H03F 3/45632* (2013.01)

(58) Field of Classification Search
CPC ........ G06G 7/164; G06N 3/02; G06N 3/0635; H03F 3/45179; H03F 3/45632; H03F 3/45197; H03F 3/005; G06F 7/16
(Continued)

(56) References Cited

U.S. PATENT DOCUMENTS

| | | | |
|---|---|---|---|
| 5,305,250 A * | 4/1994 | Salam | G06N 3/0635 708/835 |
| 7,010,563 B2 * | 3/2006 | Comer | G06G 7/16 708/835 |

(Continued)

*Primary Examiner* — Tan V Mai
(74) *Attorney, Agent, or Firm* — Weiss & Moy, PC; Jeffrey D. Moy

(57) ABSTRACT

A multiplier has a MOSFET in a common source configuration. A MOSFET current source is coupled to a drain terminal of the MOSFET. An inverter has an input coupled to the drain terminal of the MOSFET. An output of the inverter gates two currents whose current magnitudes are proportional. A first capacitor has a first terminal coupled to a first of the two currents and a gate of the MOSFET and a second terminal grounded. A second capacitor has a first terminal coupled to a second of the two currents and a second terminal coupled to the first of the two currents. The multiplier is first reset by discharging a gate capacitance of the MOSFET and then allowing it to be recharged to a Vt comparator threshold after which a charge is removed from the gate terminal of the MOSFET reducing a voltage on the gate terminal below the Vt comparator threshold, causing the two currents to be enabled until the Vt comparator threshold reaches a previous Vt comparator threshold and the inverter turns off the two currents. In a next reset phase, the second capacitor holds a multiplied value of charge.

5 Claims, 5 Drawing Sheets

Related U.S. Application Data

(60) Provisional application No. 62/637,507, filed on Mar. 2, 2018.

(58) Field of Classification Search
USPC .......................................... 708/835, 837, 838
See application file for complete search history.

(56) References Cited

U.S. PATENT DOCUMENTS

| 9,148,140 | B1* | 9/2015 | Tanase | ............... | H03K 17/6871 |
| 2014/0328090 | A1* | 11/2014 | Takahashi | ......... | H02M 3/33546 |
| | | | | | 363/21.17 |

* cited by examiner

SINGLE TRANSISTOR MULTIPLIER AND METHOD THEREFOR

RELATED APPLICATIONS

This patent application is related to U.S. Provisional Application No. 62/637,507 filed Mar. 2, 2018, entitled "SINGLE TRANSISTOR MULTIPLIER" in the name of David Schie, and which is incorporated herein by reference in its entirety. The present patent application claims the benefit under 35 U.S.C § 119(e).

TECHNICAL FIELD

The present invention generally relates to a multiplier circuit and, more particularly to, a multiplier circuit having a reduced number of transistors.

BACKGROUND

Machine learning is heavily reliant upon multiplication. Neurons within a neural network 10 for example may be connected with a one-to-many architecture that relies upon a multiplier within each of a huge number of connections as illustrated in FIG. 1. In the neural network 10, the circles 12 are neurons having input data. The lines 14 are multipliers which multiply the input data by a weight (w). The result may be fed to a decision circuit or to subsequent layers and that output in turn fed to the next layer. As each neuron, containing a summer of the weighted inputs and in some cases a decision circuit, may be connected to many neurons in the following layers, therefore the number of weights can be very large.

Machine learning generally relies upon digital multipliers which require large numbers of transistors to perform a multiply and accumulate function. By necessity each bit in the digital words being multiplied require at least two transistors and the gates which perform the bitwise multiplication require at least four transistors each. Once additional transistors related to movement of the bits are taken into account the number of transistors can grow large even for reduced bit count input words. Additionally, it typically takes several cycles to perform the loading and multiply activities in a digital system which is a significant amount of time.

To improve throughput, digital architectures utilize multiple parallel threads to allow execution of multiple multiplies at the same time, and loading architectures, such as systolic architectures, which minimize the loading overhead. Nevertheless, even more overhead is required to accommodate the multi-threading and systolic architectures and to break problems into streams which can be executed in parallel.

Therefore, it would be desirable to provide a system and method that overcome the above problems. The system and method would provide a multiplication device that could be created utilizing a smaller number of transistors.

SUMMARY

In accordance with one embodiment, a multiplier is disclosed. The multiplier has a MOSFET in a common source configuration used as a comparator correlated to a Vt comparator threshold. A current source is coupled to a drain terminal of the MOSFET. An inverter has an input coupled to the drain terminal of the MOSFET. An output of the inverter gates two currents, I1 and I2, whose current magnitudes are proportional. A first capacitor has a first terminal coupled to a first I1 of the two currents and a gate of the MOSFET and a second terminal grounded. A second capacitor has a first terminal coupled to a second I2 of the two currents and a second terminal coupled to the first I1 of the two currents and to the gate of the MOSFET. The multiplier is first reset by using the MOSFET in I1 and I2 to discharge the second capacitor. Thereafter, the MOSFET gate is pulled below a threshold (Vt) of the MOSFET and turning on only I1 which charges a gate capacitance until the inverter turns off the current. Once the Vt comparator threshold is reached an input charge is removed from the gate terminal of the MOSFET reducing a voltage on the gate terminal below the Vt comparator threshold. Falling below the Vt comparator threshold causes the two currents I1 and I2 to be enabled until the comparator reaches the Vt comparator threshold and the inverter turns off the two currents. At this time the second capacitor holds a multiplied value of charge which is used for one of converted to a voltage by a magnitude of the second capacitor or used in a subsequent multiplier. Alternatively, both currents I1 and I2 may be used to find the Vt comparator threshold during the reset and then the second capacitor may be discharged by an additional switch to ground at the first terminal of the second capacitor and a reset MOSFET from the gate of MOSFET to ground.

In accordance with a second embodiment, a weighted summer is disclosed. In a first cycle MNR takes the voltage on the gate of MN1 below the Vt comparator threshold and I1 charges it until the Vt comparator threshold which causes the drain of MN1 to fall and the inverter to turn off the current sources. Thereafter, during a first cycle one or more current sources programmed proportional to I2 to represent weight values are gated by pulses proportional to input charges to removed a charge from MN1 as the weighted sum of inputs. In a second cycle I2 charges the gate of MN1 back to its trip voltage replacing the removed weighted charge. The time it takes to recharge said charge, represented by a pulse at the output of the inverter, may be used as the input pulse to gate charge in subsequent multipliers and represents a pulse proportional to the multiplied output charge.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

Figure 1:
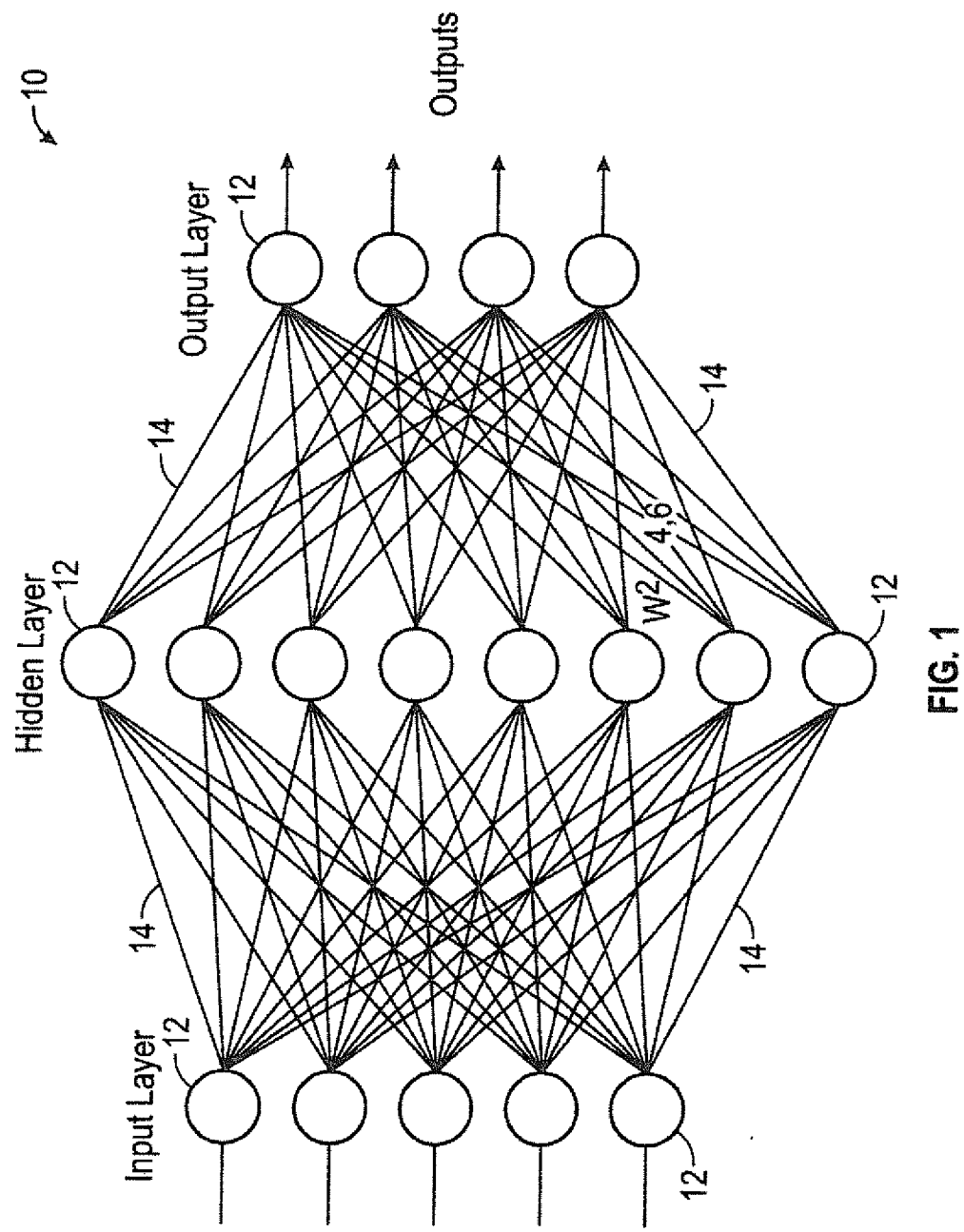
FIG. 1 is a block diagram showing an exemplary embodiment of a neural network architecture that relies upon a multiplier within each connection engine in accordance with one aspect of the present application.
Figure 2:
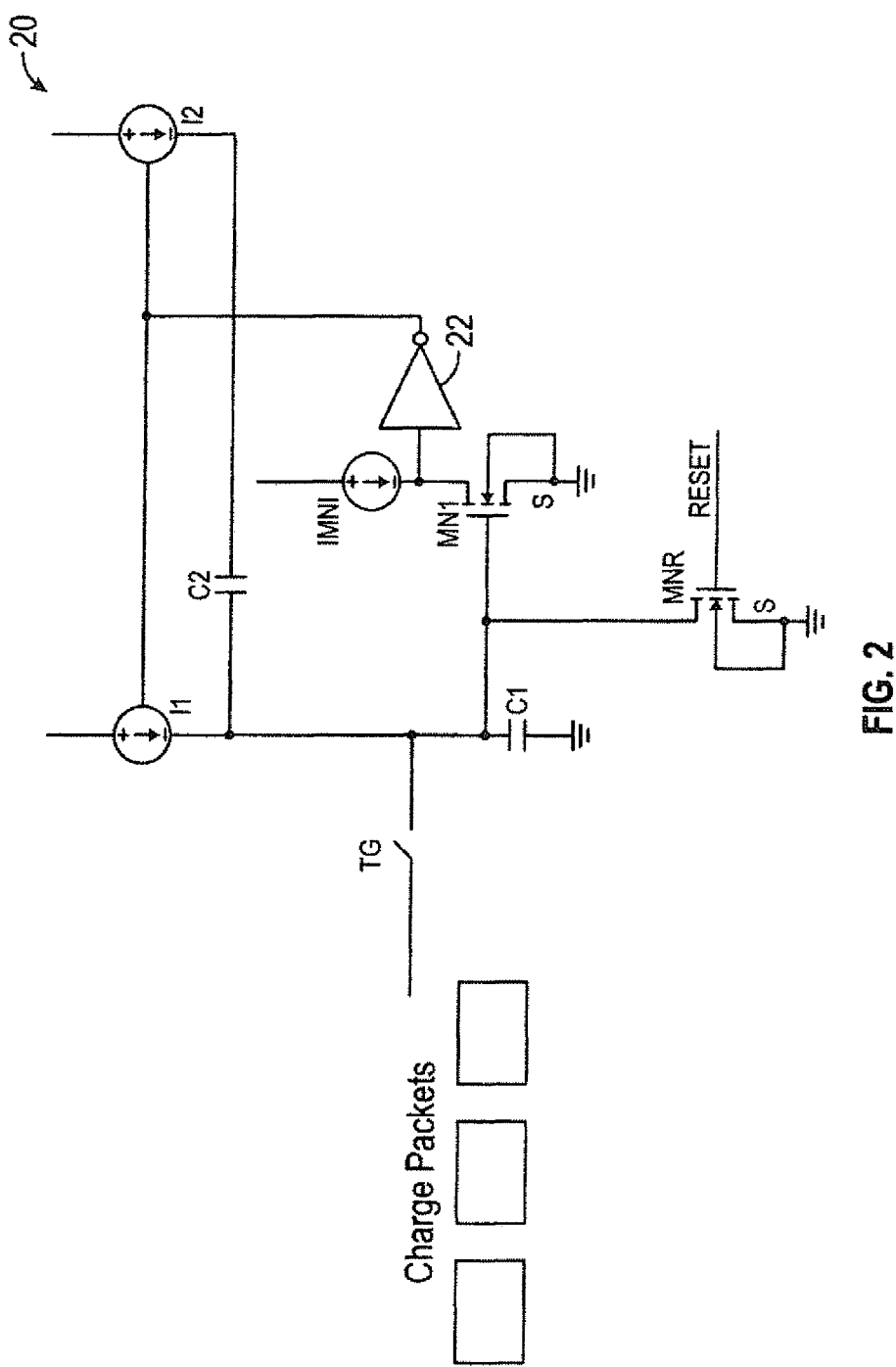
FIG. 2 is block diagram showing an exemplary embodiment of a multiplier in accordance with one aspect of the present application.

Referring to FIG. 2, one embodiment of a multiplier 20 having a reduced number of transistors may be seen. In accordance with one embodiment, the multiplier 20 may have a MOSFET MN1. The MOSFET MN1 may be arranged in a common source configuration. A current source $I_{MN1}$ may be coupled to the drain of the MOSFET MN1. An inverter 22 may be coupled to the drain terminal of the MOSFET MN1. An output of the inverter 22 may be used for gating two current sources I1 and I2 whose current magnitudes may be proportional.

A capacitor C1 may have a terminal coupled to the first current source I1 and to the gate of the MOSFET MN1. A second terminal of the capacitor C1 may be grounded. The first current source I1 may be coupled to a second terminal of a capacitor C2 and to the gate of the MOSFET MN1. The second current source I2 may be coupled to the first terminal of the second capacitor C2.

A reset switch may be coupled to the gate of the MOSFET MN1. In accordance with one embodiment, the reset switch may be a reset transistor MOSFET MNR. In the present embodiment, the MOSFET MNR may be configured in a common source configuration. A gate terminal of the MOSFET MNR may be coupled to a reset signal RESET.

A transfer gate TG may be coupled to the gate terminal of the MOSFET MN1, the first terminal of the capacitor C1, the second terminal of C2 and the current source I1. The multiplier 20 may operate in the following manner. Initially, the transfer gate TG is open and the current source MOSFETs which create I1 and I2 discharge the capacitor C2 by pulling it to the rail or alternatively an additional current source is coupled to the second terminal of the capacitor C2 and the MOSFET MNR is held low. Once the capacitor C2 is discharged other transistors are turned off. The reset transistor MOSFET MNR pulls the gate below the trip threshold Vt and the current source I1 is enabled to start charging the MN1 gate node. At some point the voltage on the gate of the MOSFET MN1 causes the drain of the MOSFET MN1 to invert and the output of the inverter 22 turns off the current source I1. The gate terminal of the MOSFET MN1 is now a voltage which corresponds to a comparator threshold Vt. Alternatively, C2 may be reset twice and I1+I2 used to establish the Vt threshold to maintain constant charging currents and reduce the change of slope related errors.

As may be seen in FIG. 2, charge packets may be introduced to the left side of the transfer gate TG. In accordance with one embodiment, the charge packets are negative charge packets. The current sources I1 and I2 may be programmed proportional to each other to form the desired multiplicand. When the transfer gate TG is turned on, a charge is removed proportional to the charge in the negative charge packet. Thus, when the negative charge packet is introduced at the transfer gate TG, the charge at the gate of the MOSFET MN1 is removed in proportion to the negative charge packet. This reduces the voltage on the gate of the MOSFET MN1 in proportion to the negative charge applied.

The charge packet could be a current source discharging the MN1 gate capacitance. The charge packet could also be a charge removed in conformance with charge stored in the charge reservoir of a pinned photodiode from an active pixel or the floating diffusion from an active pixel or the output of a CCD shift register. In some cases, such as a gated current source discharging the MN1 gate capacitance, a transfer gate is not required.

After transfer gate TG is turned on and the voltage on the gate of the MOSFET MN1 falls in proportion to the input charge below the Vt comparator threshold, the current sources I1 and I2 are turned on. The capacitor C1 is charged by I1+I2 until the Vt comparator threshold is reached at which time the inverter 22 turns off the current sources I1 and I2. The time it takes to charge the capacitor C1 to the Vt comparator threshold may be represented by the equation tcharge=Qin/(I1+I2). During this time the capacitor C2 is charged by the current source I2 only. This occurs for a time Qin/(I1+I2) putting a charge of Qin*I2/(I1+I2) into the capacitor C2. Thus, the input charge has been multiplied by I2/(I1+I2) and stored on the capacitor C2.

C2 now contains the multiplied charge. The charge magnitude could be utilized in subsequent summing or multiplying stages, could be read out differentially as a voltage or could be transferred to a known capacitance for read out. It is important to note that where the information of interest is purely the charge, the actual capacitance values may be irrelevant other than having to be large enough to hold the charge. This can be a very useful circuit in an active pixel application for example since one can directly use the integrated charge as the input to the multiplier 20.

It should be noted that the capacitor C1 could be the parasitic capacitance of the MOSFET MN1, MOSFET MNR drain capacitor, current source I1 drain capacitance and transfer gate TG overlap capacitance. It is not necessary to control the value of this capacitor as it is just being used as a charge receptacle. The capacitor C2 can be a very small capacitor as it is only integrating a charge whose magnitude will be no greater than that on the capacitor C1. The cycle by cycle reset to the Vt trip point acts as a correlated double sampling mechanism, removing flicker noise as well as trip point variations due to process or temperature.

Figure 3:
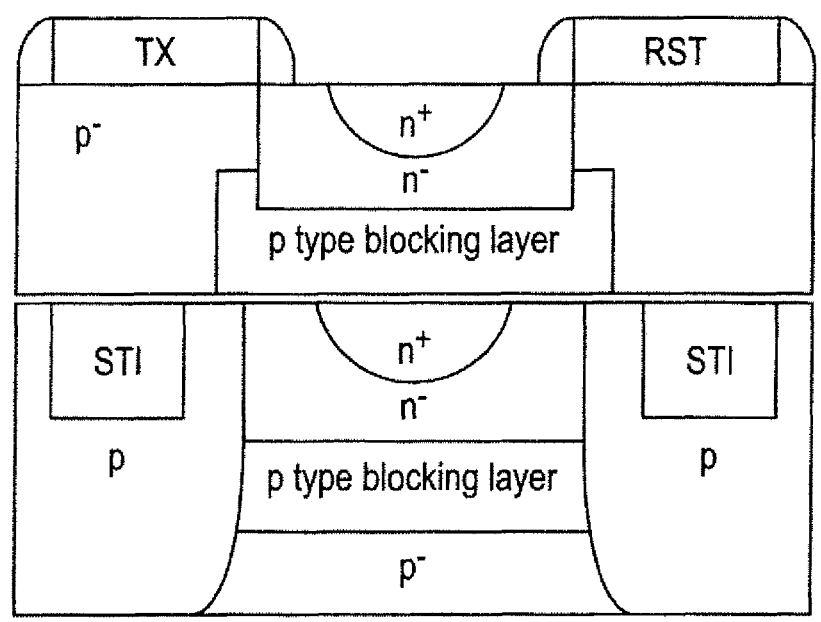
FIG. 3 shows a cross-sectional view of an exemplary embodiment of depleted junction structures which are optimized to reduce overlap capacitance in accordance with one aspect of the present application.

To reduce charge injection, the transfer gate TG, MOSFET MN1, MOSFET MNR and the current sources I1 and I2 may be created using depleted junction structures which further are optimized to reduce overlap capacitance. An example of such a structure may be seen in FIG. 3. These structures may be used to enable capacitors in the femtofared (fF) or fractions of fF range and therefore can be filled very fast requiring very little power to do so. By coupling the input charge directly, for example from a pinned photodiode in an active pixel as a direct input from the photodetector one can save a charge to voltage or current conversion compared to conventional systems which improves noise (each conversion adds noise, cost, power and latency as does digitization).

The current sources I1 and I2 in the multiplier 20 may be difficult to program directly. The circuit in FIG. 4 may help to overcome this issue. A four quadrant transconductor may be coupled to the single transistor multiplier 20 shown in FIG. 2.

Figure 4:
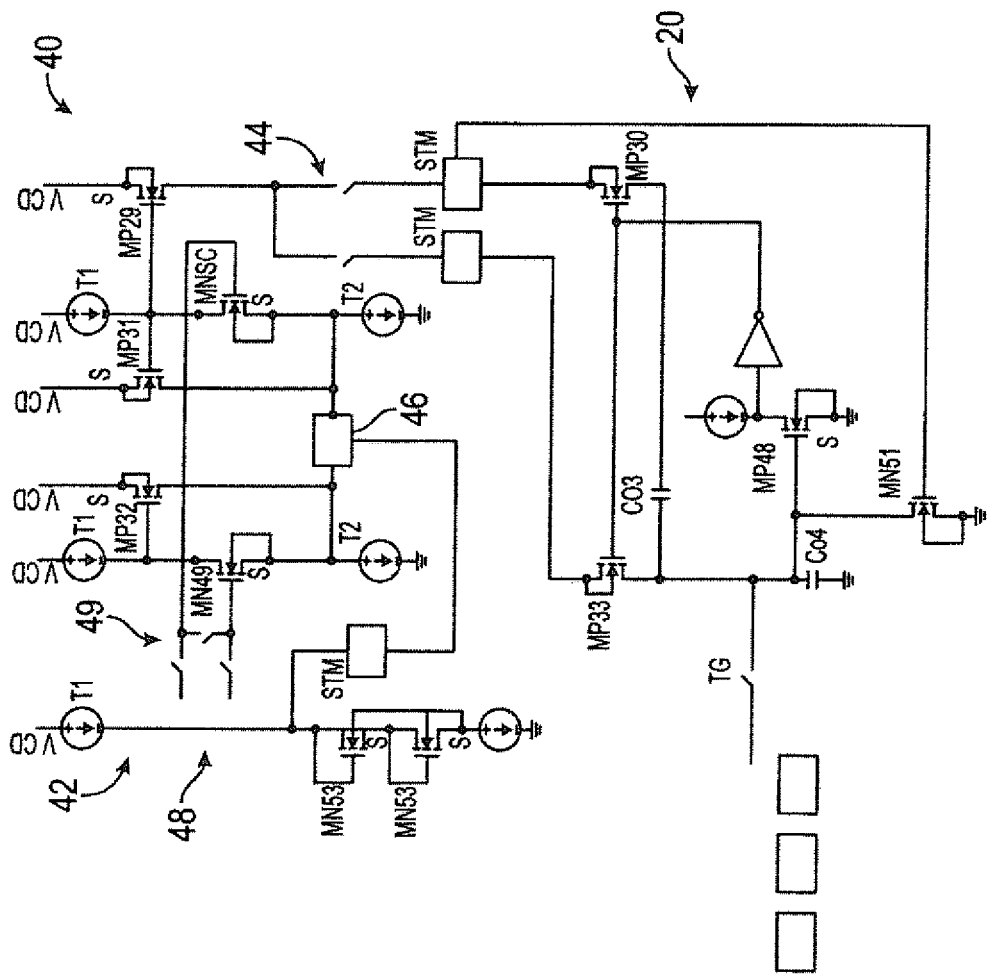
FIG. 4 is block diagram showing an exemplary embodiment of a multiplier coupled to a transconductor in accordance with one aspect of the present application.

As shown in FIG. 4, a transconductor 40 may be seen. The transconductor 40 is coupled to the multiplier 20. Switches 44 may be used to couple the transconductor 40 to the multiplier 20. The two voltage inputs 48 to the multiplier 20 are very low leakage capacitors or NVM memory.

To achieve the direct programming of current sources I1+I2 (currents in the multiplier 10) by the voltage differential the following may be performed. The difference between the currents in the transconductor 40 should be sampled by eliminating the voltage drop across the transconductor resistor 46 by turning on switch 49 and sample and holding the result. This current is then used as the I2 current in the multiplier 20. One may then use the same sampled current and remove it with MOSFET MNR during the second phase charging stage. Thereafter an input 48 or $\Delta V$ is applied across resistor r 46 as a differential voltage across the inputs of the transconductor 40. The resulting multiplicand of the input charge is therefore $(I1-I2)/(\Delta V/r)$ where in this case I2-I1 is the difference in transconductor biasing currents not the current sources in the multiplier 20.

In a calibration phase (I2−I1) may be adjusted for errors in r. Alternatively, I2−I1 may be adjusted by making r a variable resistor. The result is that we can set the charge multiplicand according to $(I2-I1)/(\Delta V/r)$. In accordance with one embodiment, the transconductor resistor 46 may be a ferromagnetic memristor. It could also be a transistor biased in the triode region from a series pair of diode connected devices biased by a current 42 of magnitude I1. If I1 and I2 are also biased with a constant transconductance biasing circuit then (I2−I1) and r becomes dependent only upon geometry and process and temperature dependencies are divided out.

The transconductor 40 may be shared amongst multiple multipliers. For example, in a broadcast systolic architecture one could fanout multiple copies of the transconductor currents to produce multiple replicas of the weight operands.

In place of the input charge packets a gated current source might also be used. In this case the transfer gate is not necessary. The gating of the current source would remove charge from the gate of the MOSFET MN1 bringing the gate voltage below the Vt comparator threshold. After the current source turns off the circuit would operate as described earlier after the transfer gate is turned on.

Figure 5:
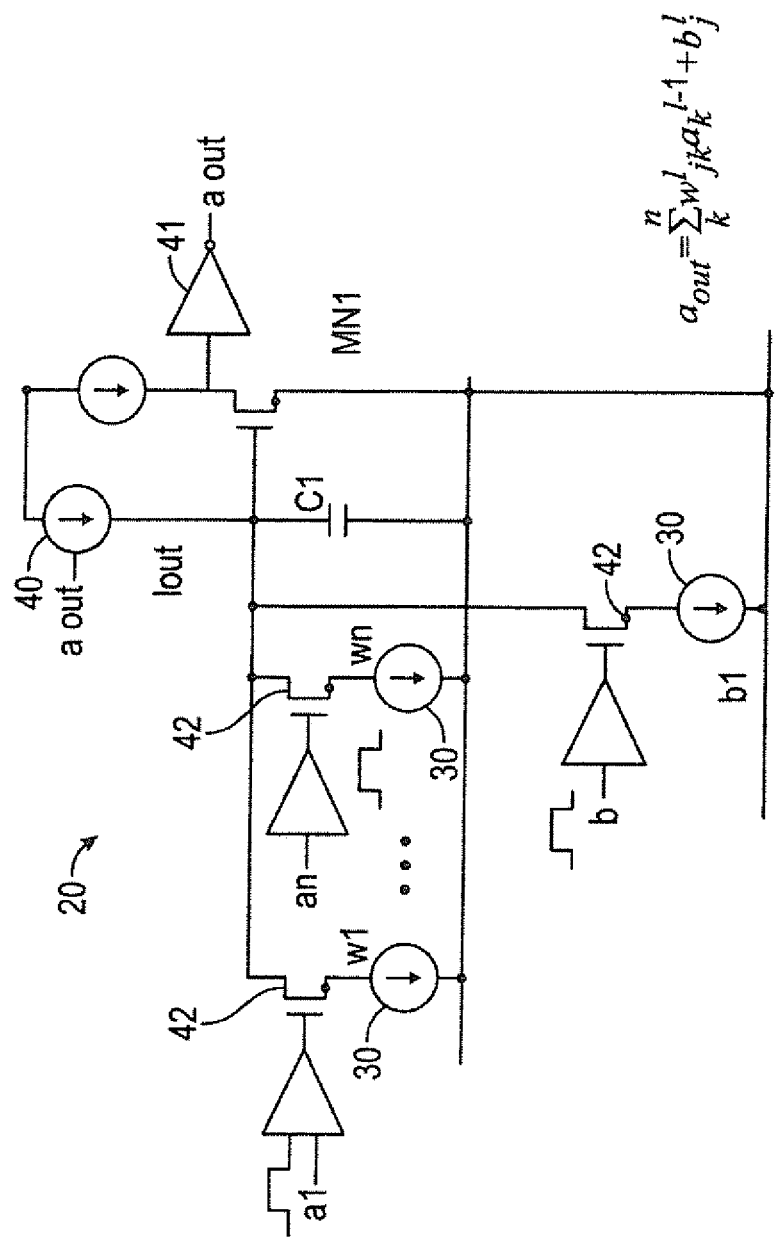
FIG. 5 is a block diagram showing an exemplary embodiment of a weighted summer with a pulse output in accordance with one aspect of the present application.

Referring to FIG. 5 an embodiment showing weighted summer 20 may be considered. Here a single charge reservoir is shown consisting of the gate of the MOSFET MN1 which is also connected to the capacitor C1 (which could be a capacitor or floating diffusion), the drain of the gating MOSFETs 42 and current source 40 also known as Iout. Charge movement means 30 labelled w1 and wn and bias b1 are programmed in conformance with desired weight inputs and in proportion to current source Iout 40. These weight inputs are gated by time inputs a1, an, and b which are shown connected to a buffer driving the gates of MOSFETs 42. During a reset the gate of MOSFET MN1 is pulled below its Vt comparator threshold, which will cause the drain of MOSFET M1 to invert and allow inverter 41 to turn on current source 40 until the MPSFTE MN1 gate reaches its switching threshold after which it is switched off. In a first cycle, the time plurality of pulse inputs a1 . . . an and b effectively allow the weights to flow for a given amount of time resulting in a weighted charge to be removed from the charge reservoir at the gate of MN1. Once this current is removed MN1's drain will again flip and cause the inverter 41 to turn on the current source Iout which will replace the charge removed by the weighted inputs. The time it takes to do so will represent a weighted sum output pulse at aout.

While embodiments of the disclosure have been described in terms of various specific embodiments, those skilled in the art will recognize that the embodiments of the disclosure may be practiced with modifications within the spirit and scope of the claims

What is claimed is:

1. A multiplier comprising:
a MOSFET in a common source configuration,
a current source coupled to a drain of the MOSFET;
an inverter having an input coupled to the drain of the MOSFET and an output of the inverter gates two currents whose current magnitudes are proportional;
a first capacitor having a first terminal coupled to a gate of the MOSFET;
a second capacitor coupled to the two currents;
wherein a signal is sent to the gate of the MOSFET to reset the multiplier by discharging a gate capacitance of the MOSFET until the inverter turns off the two currents to establish a Vt comparator threshold, a charge is then removed from the gate of the MOSFET reducing a voltage on the gate below the Vt comparator threshold causing the two currents to be enabled until the Vt comparator threshold reaches a previous Vt comparator threshold and the inverter turns off the two currents, in a next reset phase, the second capacitor holds a multiplied value of charge.

2. A multiplier comprising:
a MOSFET in a common source configuration,
a current source coupled to a drain of the MOSFET;
an inverter having an input coupled to the drain of the MOSFET and an output of the inverter gates two currents whose current magnitudes are proportional;
at least one capacitive element coupled to the two currents and the gate of the MOSFET;
wherein a signal is sent to the gate of the MOSFET to reset the multiplier by discharging a gate capacitance of the MOSFET until the inverter turns off the two currents to establish a Vt comparator threshold, a charge is then removed from the gate of the MOSFET reducing a voltage on the gate below the Vt comparator threshold causing the two currents to be enabled until the Vt comparator threshold reaches a previous Vt comparator threshold and the inverter turns off the two currents, in a next reset phase, the second capacitor holds a multiplied value of charge.

3. The multiplier of claim 2, comprising a transconductor coupled to the multiplier, the transconductor providing programming of the two currents.

4. The multiplier of claim 3, comprising switches coupling the multiplier to the transconductor.

5. The multiplier of claim 3, wherein the transconductor comprises a sample and hold circuit and two current sources, wherein a difference in biasing currents of the two current sources is used as the second of the two currents in a multiplier and wherein a current is removed from said first current source using the sample and hold circuit which samples the difference in biasing currents during a phase where inputs to the transconductor is zero.

* * * * *